US012750985B2

(12) United States Patent
Tsorng et al.

(10) Patent No.: US 12,750,985 B2
(45) Date of Patent: Sep. 29, 2026

(54) SELF-ALIGNING CONNECTOR FOR LIQUID COOLING OF A COMPUTING DEVICE

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Hung-Wei Chen, Taoyuan City (TW); Yu-Cheng Chang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 308 days.

(21) Appl. No.: 18/643,498

(22) Filed: Apr. 23, 2024

(65) Prior Publication Data

US 2025/0227880 A1 Jul. 10, 2025

Related U.S. Application Data

(60) Provisional application No. 63/619,426, filed on Jan. 10, 2024.

(51) Int. Cl.
*H05K 7/20* (2006.01)
*F28F 9/02* (2006.01)

(52) U.S. Cl.
CPC ....... *H05K 7/20781* (2013.01); *F28F 9/0258* (2013.01); *H05K 7/20272* (2013.01); *H05K 7/20772* (2013.01)

(58) Field of Classification Search
CPC ........... H05K 7/20272; H05K 7/20781; H05K 7/20772; F28F 9/0258; F16L 27/026
See application file for complete search history.

(56) References Cited

U.S. PATENT DOCUMENTS

| | | | | |
|---|---|---|---|---|
| 9,351,428 | B2 * | 5/2016 | Eckberg | F16L 37/34 |
| 11,892,252 | B2 * | 2/2024 | Yang | H05K 7/20772 |
| 2011/0303593 | A1 | 12/2011 | Reinhardt | |
| 2024/0414891 | A1 * | 12/2024 | Wu | H05K 7/20772 |
| 2025/0081393 | A1 * | 3/2025 | Wu | H05K 7/20781 |

FOREIGN PATENT DOCUMENTS

| | | | |
|---|---|---|---|
| CN | 203297806 | U | 11/2013 |
| TW | I743776 | B | 10/2021 |

OTHER PUBLICATIONS

TW Office Action for Application No. 113131082 mailed Apr. 30, 2025, w/ First Office Action Summary, 6 pp.
TW Search Report for Application No. 113131082 mailed Apr. 30, 2025, w/ First Office Action, 1 p.

* cited by examiner

*Primary Examiner* — Zachary Pape
(74) *Attorney, Agent, or Firm* — Nixon Peabody LLP

(57) ABSTRACT

A self-aligning connector for a computing system includes a case and a fluid pipe. The case has a pipe channel that extends internally, along a radial axis, between a case entry side and a case exit side. The fluid pipe is movably mounted within the pipe channel, separated from an internal surface of the pipe channel by a floating space. The fluid pipe is rotatably and linearly movable within the floating space, and includes a pipe entry side, a pipe exit side, and an internal channel for receiving a liquid coolant. The internal channel extends along the radial axis between a pipe entry end and a pipe exit end. The fluid pipe further has a tilt area that is located between the pipe entry side and the pipe exit side, and that is configured to rotatably adjust the fluid pipe relative to the case.

20 Claims, 12 Drawing Sheets

SELF-ALIGNING CONNECTOR FOR LIQUID COOLING OF A COMPUTING DEVICE

CROSS-REFERENCE TO RELATED APPLICATIONS

This application claims priority to and the benefit of U.S. Provisional Patent Application Ser. No. 63/619,426, filed Jan. 10, 2024, which is incorporated herein by reference in its entirety.

FIELD OF THE INVENTION

The present invention relates generally to computing systems, and more specifically, to self-aligning coupling of liquid cooling connectors for computing storage devices.

BACKGROUND OF THE INVENTION

Information technology systems, including server systems, require cooling to prevent overheating. Cooling demands have increased, as the power and speed of server systems have increased. For example, the development and application of 5G and Artificial Intelligence (AI) continuously increase computing demand for server products, which requires high-heat dissipation.

One solution for high-heat dissipation is liquid cooling, which has been widely used and has begun to gradually replace air cooling from fans. Liquid cooling is preferred because it removes heat much more efficiently than air cooling. Liquid-cooling server products usually transport liquid by connecting external manifolds on a server rack. The liquid removes the heat from the server and is cooled externally. Some connection methods are primarily divided into hose pair types and blind mate types. Blind mate types are sometimes preferred because they require less time for disassembly or installation of a hose, thus, reducing maintenance time.

However, the blind mate type connection is plagued by limitations. For example, manufacturing and tolerance misalignments cause assembly problems when attempting to connect liquid-cooled connectors with liquid-cooled servers. These problems are exacerbated when the liquid-cooled connectors are from different manufacturers than that of the liquid-cooled servers, resulting in failure to effectively connect and seal fluid communication with the liquid-cooled servers, cooling rack manifolds, and related cooling components. The present disclosure provides a solution for these and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a self-aligning connector is configured for a computing system and includes a case having a pipe channel extending internally, along a radial axis, between a case entry side and a case exit side. The case entry side has a case entry end and the case exit side has a case exit end. The self-aligning connector further includes a fluid pipe that is movably mounted within the pipe channel. The fluid pipe is separated from an internal surface of the pipe channel by a floating space. The fluid pipe is rotatably and linearly movable relative to the radial axis within the floating space. The fluid pipe includes a pipe entry side with a pipe entry end positioned at the case entry side, a pipe exit side having a pipe exit end positioned at the case exit side, and an internal channel for receiving a liquid coolant. The internal channel extends along the radial axis between the pipe entry end and the pipe exit end. The fluid pipe further includes a tilt area that is located between the pipe entry side and the pipe exit side. The tilt area is configured to rotatably adjust the fluid pipe relative to the case.

According to certain aspects of the self-aligning connector disclosed above, an entry holder is mounted over the pipe entry side. The entry holder prevents linear movement towards the case entry end when the entry holder is in contact with an entry internal surface of the case entry side.

According to certain aspects of the self-aligning connector disclosed above, the entry holder is in direct contact with the entry internal surface.

According to certain aspects of the self-aligning connector disclosed above, an exit holder is mounted over the pipe exit side. The exit holder prevents linear movement towards the case exit end when the exit holder is in contact with an exit internal surface of the case entry side.

According to certain aspects of the self-aligning connector disclosed above, the exit holder is in indirect contact with the exit internal surface.

According to certain aspects of the self-aligning connector disclosed above, a spring is mounted between the exit holder and the case exit end. The exit holder is in direct contact with the spring at a first spring end. The spring is in direct contact with the exit internal surface at a second spring end.

According to certain aspects of the self-aligning connector disclosed above, a cover is mounted to the case exit end and forming the exit internal surface.

According to certain aspects of the self-aligning connector disclosed above, the tilt area has a spherical shape.

According to certain aspects of the self-aligning connector disclosed above, the tilt area has a tilt diameter that is larger than at least one of a pipe entry diameter and a pipe exit diameter.

According to certain aspects of the self-aligning connector disclosed above, the pipe exit end is configured for coupling with a liquid cooling pipe.

According to certain aspects of the self-aligning connector disclosed above, the pipe entry end is configured for insertion into a connector socket.

According to certain aspects of the self-aligning connector disclosed above, the fluid pipe is linearly movable within the floating space in one or more translational directions. The one or more translational directions include a first direction along the radial axis and parallel to a length of the case. The one or more translational directions further include a second direction perpendicular to the radial axis and parallel to a width of the case. The one or more translational directions include a third direction perpendicular to the radial axis and parallel to a height of the case.

According to certain aspects of the present disclosure, a computing system includes a liquid-cooling server having a liquid cooling pipe for receiving a liquid coolant. The liquid cooling pipe has an end configured for coupling with a liquid-cooling connector, which has a connector plug. The computing system further includes a rack manifold having a connector socket that is in fluid communication with the liquid-cooling server. The rack manifold is configured to circulate the liquid coolant to the liquid-cooling server. The connector socket is configured for coupling with the connector plug. The computing system further includes a self-aligning connector mounted between the liquid-cooling server and the rack manifold. The self-aligning connector provides the fluid communication and includes a case and a fluid pipe. The case has a pipe channel that extends internally, along a radial axis, between a case entry end and a case exit end. The fluid pipe is movably mounted within the pipe channel. The fluid pipe is separated from an internal surface of the pipe channel by a floating space. The fluid pipe is movable relative to the radial axis within the floating space. The fluid pipe includes a pipe entry end positioned near the case entry end and coupled to the liquid-cooling connector. The fluid pipe further includes a pipe exit end positioned near the case exit end and coupled to the liquid cooling pipe. The fluid pipe further includes an internal channel for receiving the liquid coolant. The internal channel extends along the radial axis between the pipe entry end and the pipe exit end. The fluid pipe further includes an adjustable area located between the pipe entry end and the pipe exit end. The adjustable area is configured to movably adjust the fluid pipe within the case.

According to certain aspects of the computing system disclosed above, the adjustable area is configured to rotatably adjust the fluid pipe within the case.

According to certain aspects of the computing system disclosed above, the adjustable area is configured to linearly adjust the fluid pipe within the case.

According to certain aspects of the computing system disclosed above, the adjustable area is configured to rotatably and linearly adjust the fluid pipe within the case.

According to certain aspects of the computing system disclosed above, the adjustable area is in the form of a tilt area that has a spherical shape.

According to certain aspects of the computing system disclosed above, the self-aligning connector further includes a spring mounted near the pipe exit end. The spring applies to the fluid pipe a linear force along the radial axis.

According to certain aspects of the computing system disclosed above, the self-aligning connector further includes an entry holder mounted over the fluid pipe near the pipe entry end. The entry holder prevents linear movement towards the case entry end when the entry holder is in contact with an entry internal surface of the case.

According to certain aspects of the computing system disclosed above, the self-aligning connector further includes an exit holder mounted over the fluid pipe near the pipe exit end. The exit holder prevents linear movement towards the case exit end when the exit holder is in contact with an exit internal surface of the case.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
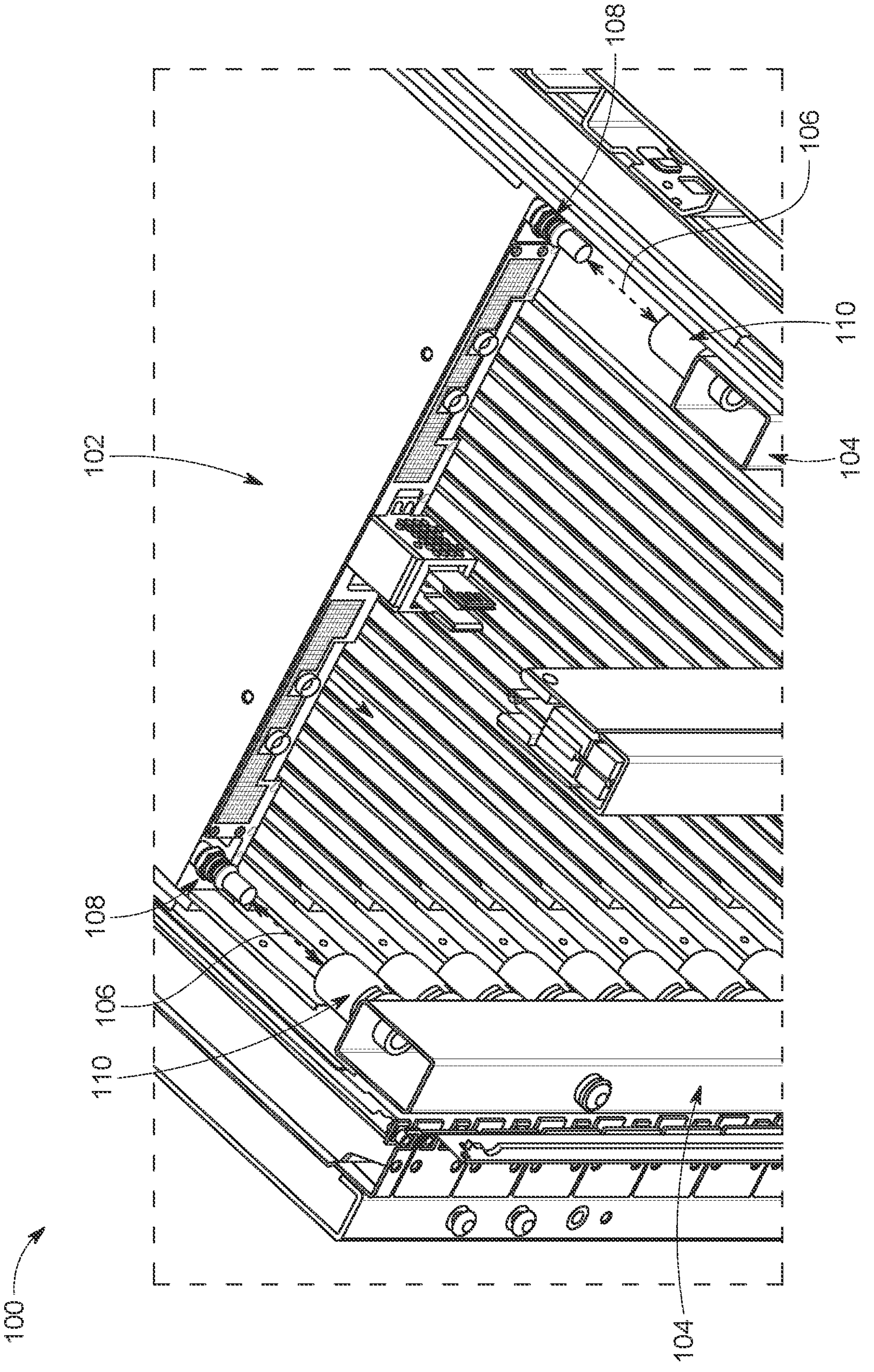
FIG. 1 is a partial perspective view of a computing system, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a computing system 100 includes at least one liquid-cooling server 102 that is configured for fluid communication with one or more rack manifolds 104. In this example one of the rack manifolds 104 is a coolant supply, while the other rack manifold 104 collects heated coolant. When coupled, a liquid coolant 106 flows between the liquid-cooling server 102 and the rack manifolds 104 to help dissipate heat caused by heat-generating components of the liquid-cooling server 102.

The liquid-cooling server 102 has one or more liquid-cooling connectors 108 via which the liquid coolant 106 is received circulated to or from the rack manifold 104. The rack manifold 104 has one or more connector sockets 110 via which the liquid coolant 106 is circulated to or from the liquid-cooling server 102. As illustrated in FIG. 1, the liquid-cooling server 102 has a pair of liquid-cooling connectors 108 and the rack manifold 104 has a plurality of pairs of connector sockets 110, each pair of connector sockets 110 being coupled, respectively, with the pair of liquid-cooling connectors 108.

Figure 2:
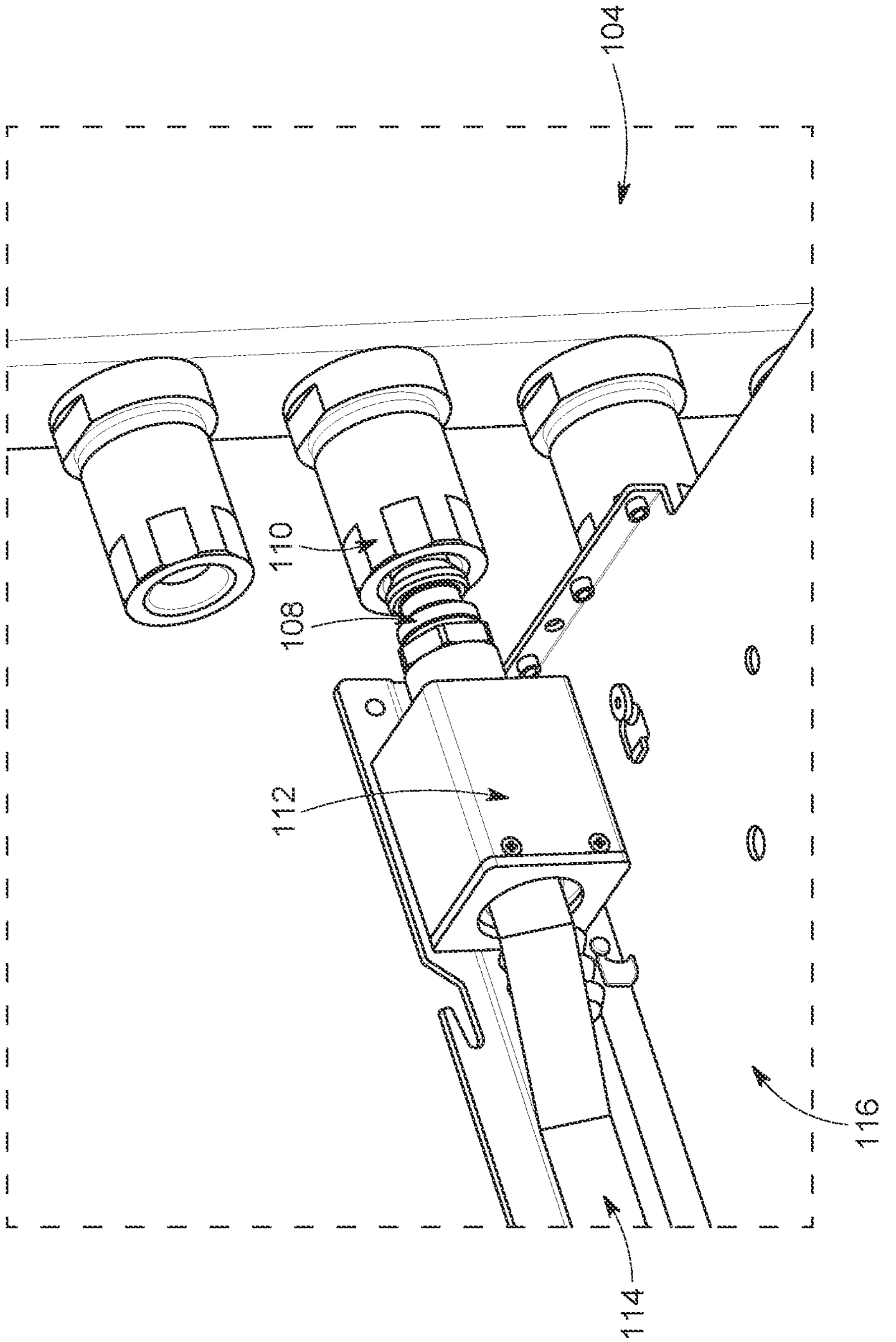
FIG. 2 is a perspective view illustrating a self-aligning connector fluidly coupling components of the computing system of FIG. 1, according to certain aspects of the present disclosure.
Figure 17:
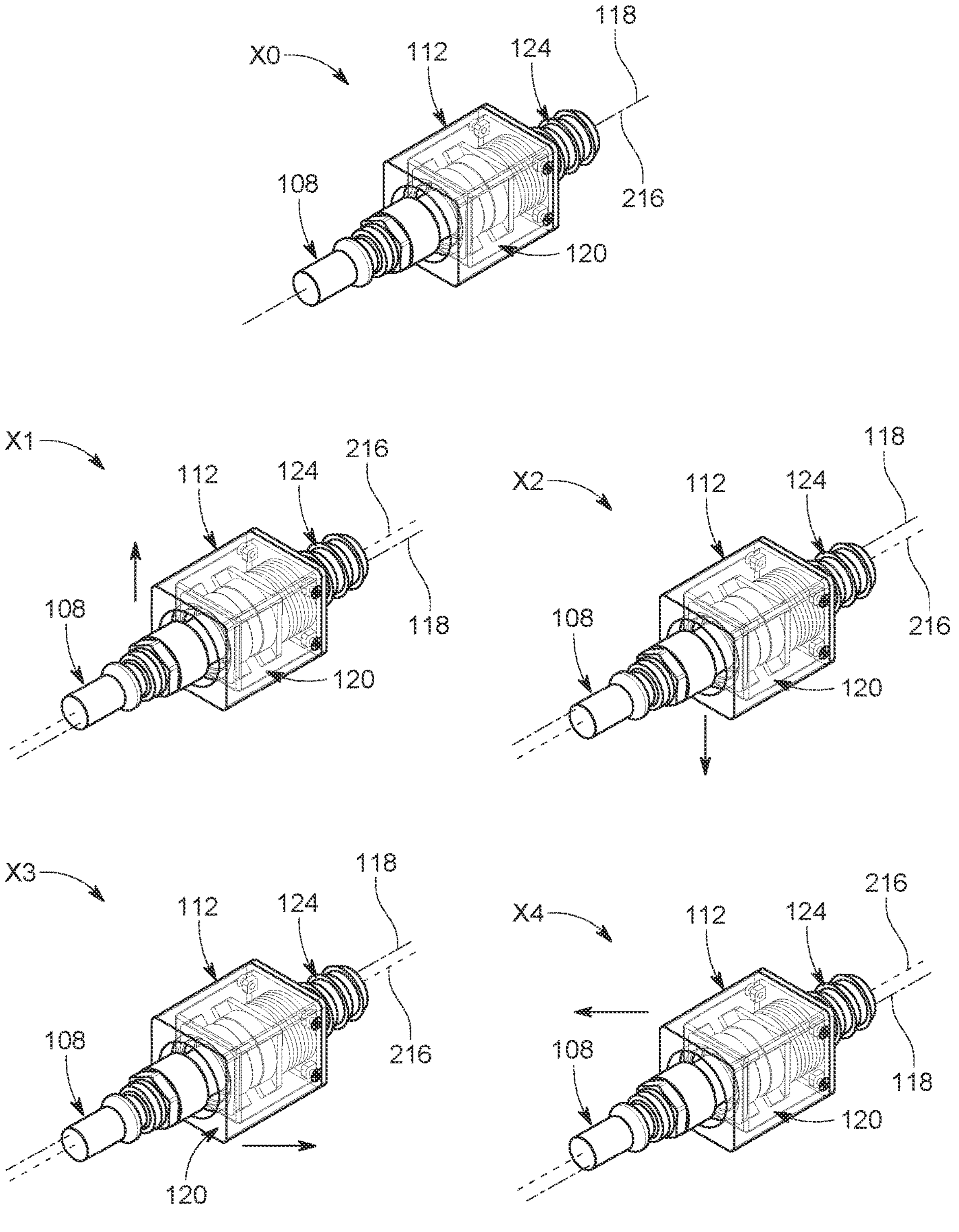
FIG. 17 is a perspective view illustrating linear adjustments of the fluid pipe within the case in a plurality of translational directions, according to certain aspects of the present disclosure.
Figure 18:
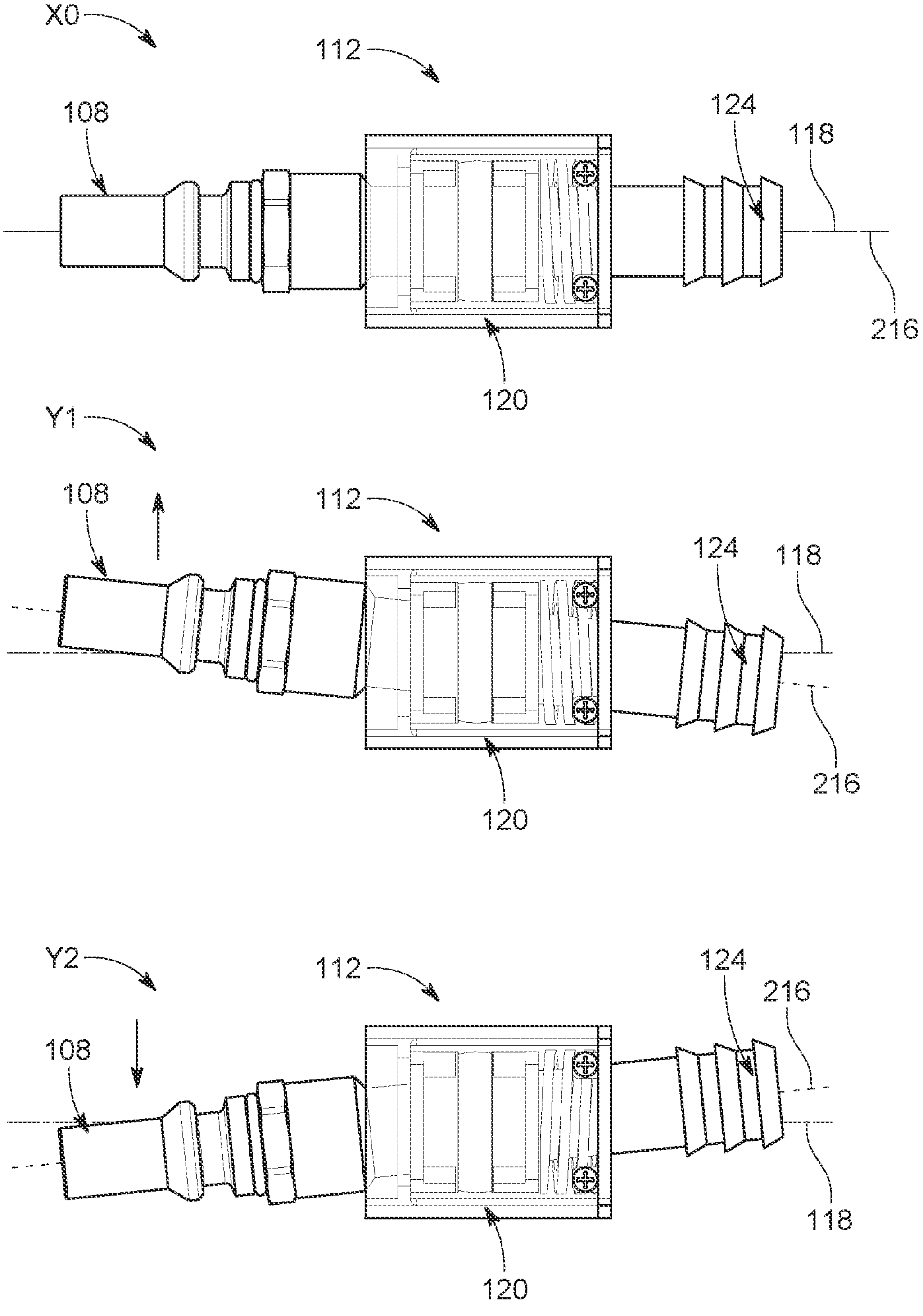
FIG. 18 is a perspective view illustrating rotational adjustments of the fluid pipe within the case in a plurality of angular directions, according to certain aspects of the present disclosure.

Referring to FIG. 2, a self-aligning connector 112 is adapted and configured for coupling a liquid-cooling connector 108 with a respective connector socket 110. The self-aligning connector 112 is beneficial for many reasons, including allowing self-adjustment when the liquid-cooling connector 108 and the connector socket 110 are misaligned. Examples of the beneficial self-adjustment are illustrated in FIGS. 17 and 18.

The self-aligning connector 112 is mounted between a liquid cooling pipe 114 and the liquid-cooling connector 108, which is then connected to the connector socket 110. The liquid cooling pipe 114 extends from the liquid-cooling server 102 (shown in FIG. 1), above a server chassis 116. The connector socket 110 extends from the rack manifold 104.

Figure 3:
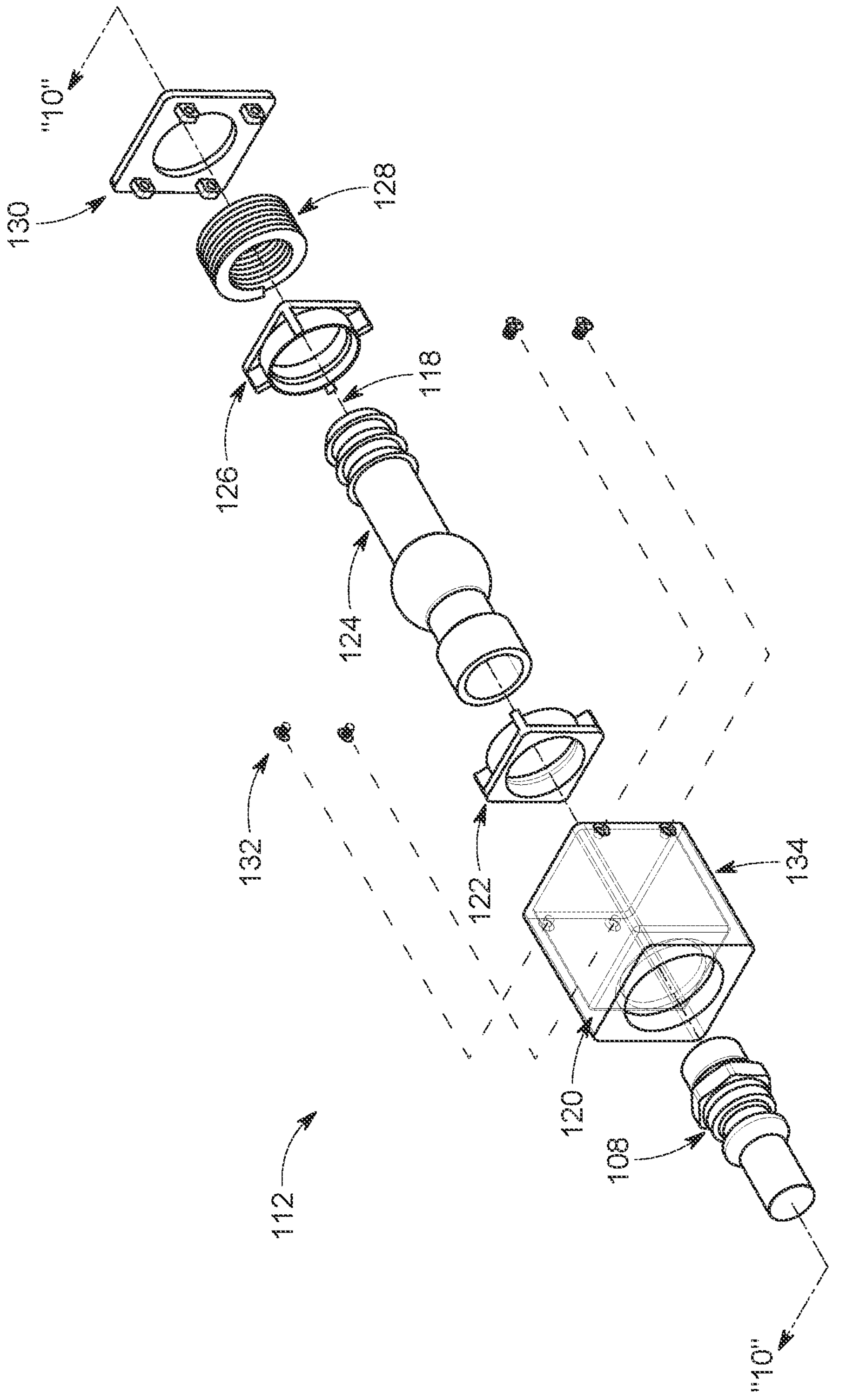
FIG. 3 is an exploded view illustrating components of the self-aligning connector in FIG. 2, according to certain aspects of the present disclosure.

Referring to FIG. 3, the self-aligning connector 112 includes a plurality of components that, together, achieve self-alignment in translational and/or angular directions relative to a radial axis 118. Specifically, the self-aligning connector 112 includes a case 120, an entry holder 122, a fluid pipe 124, an exit holder 126, a spring 128, and a cover 130. The liquid-cooling connector 108 is mounted to one end of the fluid pipe 124, as more clearly illustrated in FIG. 10. The self-aligning connector 112 further includes a plurality of fasteners 132, such as screws, that fixedly mount the cover 130 to the case 120. For example, the fasteners 132 include four separate fasteners, with two fasteners being mounted on opposite sides of the case 120, through matching fastener apertures 132 on the edge of the case 120.

Figure 4:
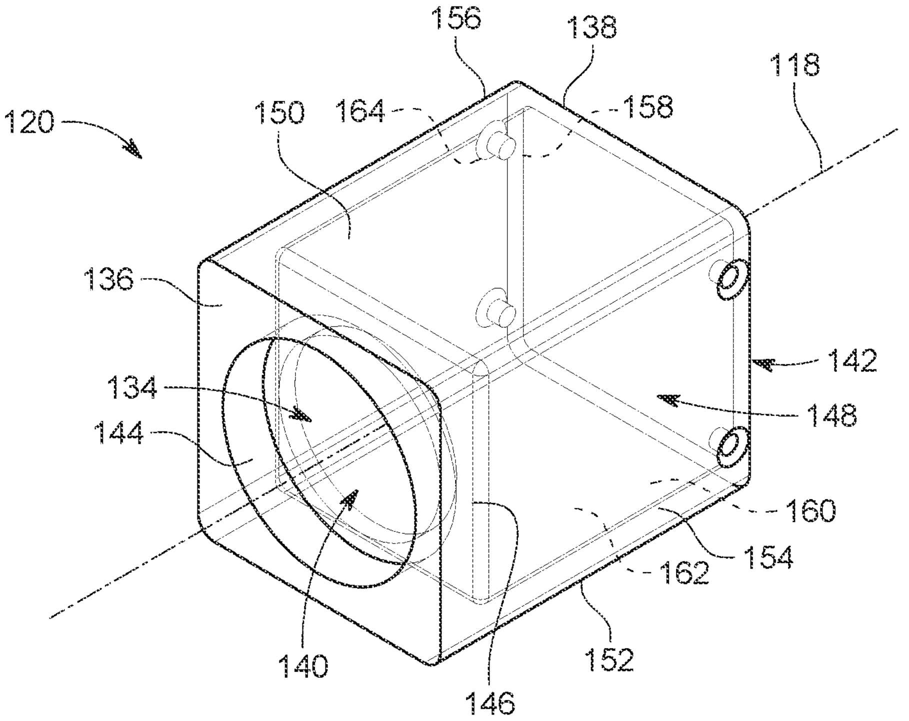
FIG. 4 is a perspective view illustrating a case of the self-aligning connector, according to certain aspects of the present disclosure.

Referring to FIG. 4, the case 120 has a pipe channel 134 that extends internally along a radial axis 118. The radial axis 118 of the case 120 forms a reference line relative to which self-aligning positions are achieved, as further disclosed below (e.g., positions X1-X4 and Y1-Y2 of FIGS. 17 and 18). The pipe channel 134 extends between a case entry side 136 and a case exit side 138. The case entry side 136 has a case entry end 140. The case exit side 138 has a case exit end 142. The pipe channel 134 has an internal surface 144, with the case entry side 136 having an entry internal surface 146.

The pipe channel 134 has a generally circular cross-sectional profile that extends between the case entry end 140 and the entry internal surface 146. The pipe channel 134 has a generally rectangular cross-sectional profile that extends between the entry internal surface 146 and the case exit end 142. Thus, the entry internal surface 146 forms a lateral, front side of a rectangular portion 148 of the pipe channel 134.

Externally, the case 120 is generally defined by a top side 150, a bottom side 152, a right side 154, and a left side 156. Internally, the rectangular portion 148 is generally defined by an internal top surface 158, an internal bottom surface 160, an internal right surface 162, and an internal left surface 164.

Figure 5:
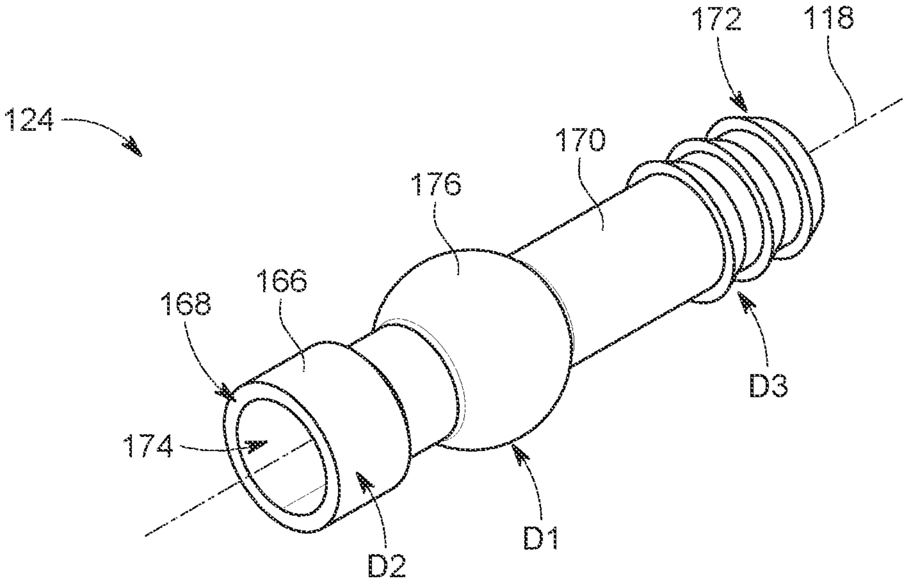
FIG. 5 is a perspective view illustrating a fluid pipe of the self-aligning connector, according to certain aspects of the present disclosure.

Referring to FIG. 5, the fluid pipe 124 has a pipe entry side 166 with a pipe entry end 168 and a pipe exit side 170 with a pipe exit end 172. The fluid pipe 124 further has an internal channel 174 for receiving the liquid coolant 106 (illustrated in FIG. 1). The internal channel 174 extends along the radial axis 118 between the pipe entry end 168 and the pipe exit end 172. The fluid pipe 124 further has a tilt area 176 located between the pipe entry side 166 and the pipe exit side 170.

The tilt area 176 has a spherical shape, according to the exemplary illustrated embodiment. Optionally, the tilt area

Figure 10:
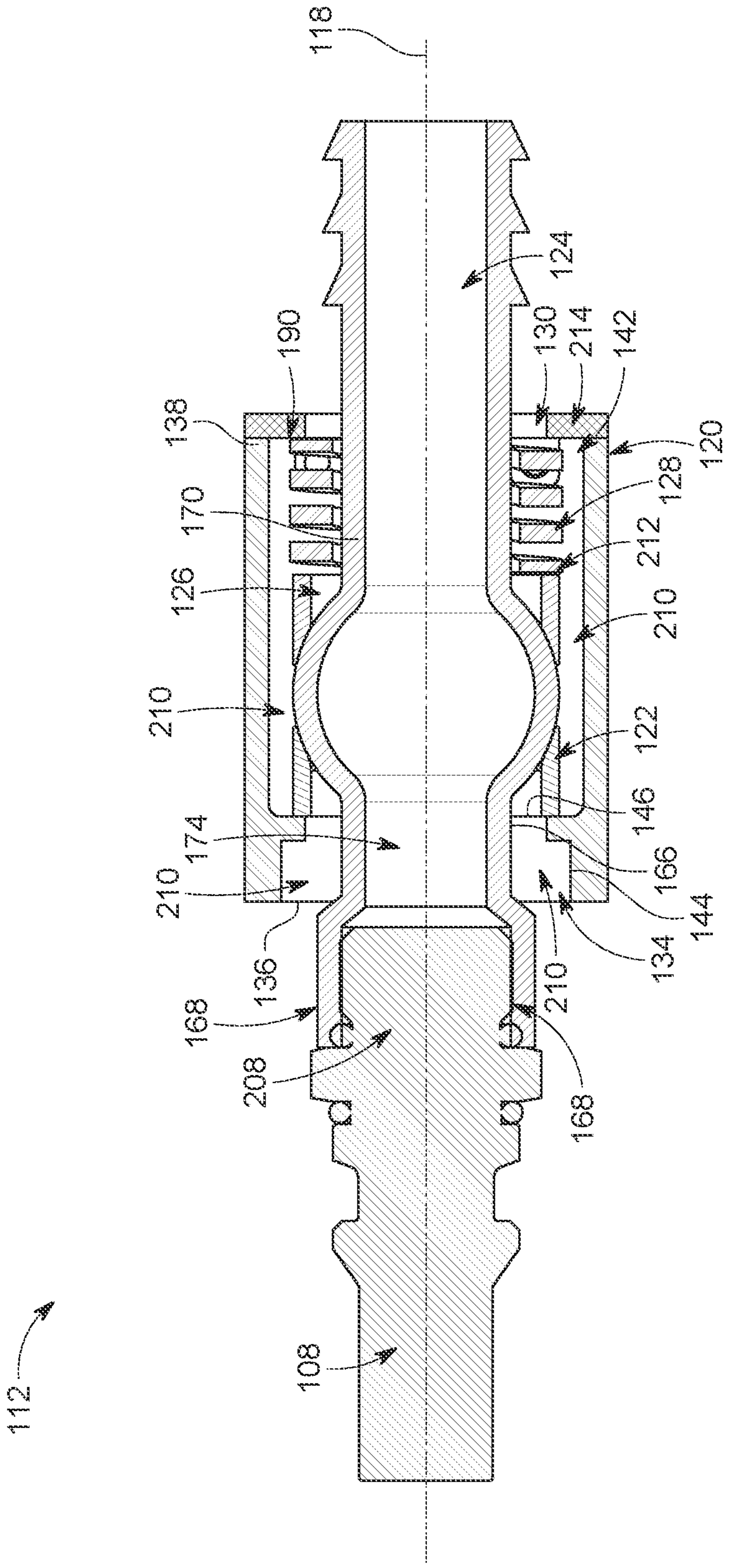
FIG. 10 is a cross-sectional view along lines "10"-"10" of FIG. 3 representing the self-aligning connector, according to certain aspects of the present disclosure.

176 has a tilt diameter D1 that is larger than at least one of a pipe entry diameter D2 and a pipe exit diameter D3. The shape and size of the tilt area 176 is configured to facilitate rotatable adjustment of the fluid pipe 124 relative to the case 120, as further disclosed below (e.g., as illustrated in FIGS. 10 and 18). As such, the tilt area 176 is in the form of an adjustable area that is configured to movably adjust the fluid pipe within the case 120. The pipe entry side 166 is configured for fluidly coupling with the liquid-cooling connector 108, and the pipe exit side 170 is configure for fluidly coupling with the liquid cooling pipe 114 (e.g., as illustrated in FIG. 2).

Figure 6:
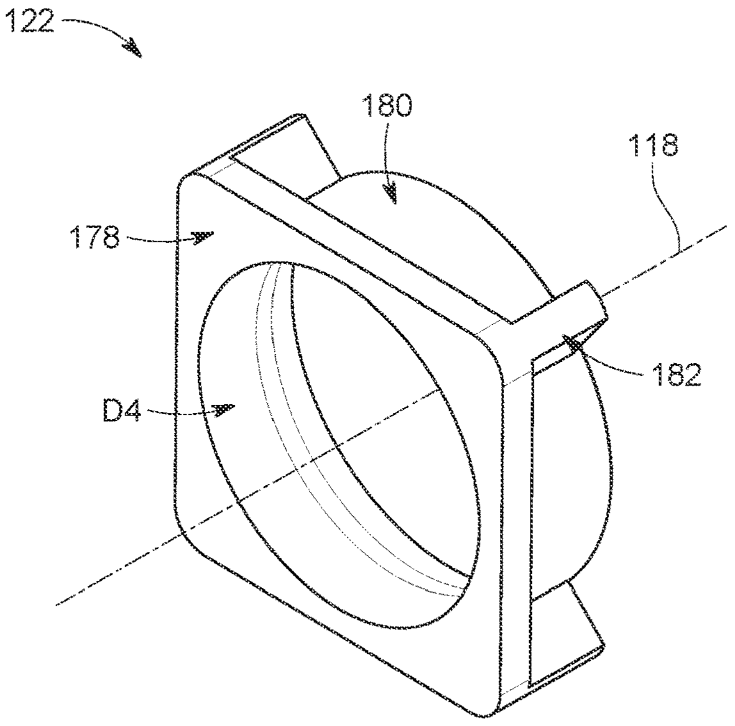
FIG. 6 is a front perspective view illustrating a holder of the self-aligning connector, according to certain aspects of the present disclosure.

Referring to FIG. 6, the entry holder 122 is configured for mounting over the pipe entry side 166 (e.g., as illustrated in FIG. 10). The entry holder 122 has an entry mounting surface 178 that has a generally rectangular or square profile. An entry mounting channel 180 extends from the entry mounting surface 178 along the radial axis 118. The entry mounting channel 180 has an entry holder diameter D4 that has a size slightly larger than the pipe entry diameter D2, for achieving a coupling fit between the entry holder 122 and the pipe entry side 166 (e.g., as illustrated in FIG. 10).

The entry holder 122 further has corner reinforcements 182 that extend above the entry mounting channel 180 at each corner of the entry mounting surface 178. The corner reinforcements 182 are generally rectangular and provide additional structural integrity between the entry mounting surface 178 and the entry mounting channel 180.

Figure 7:
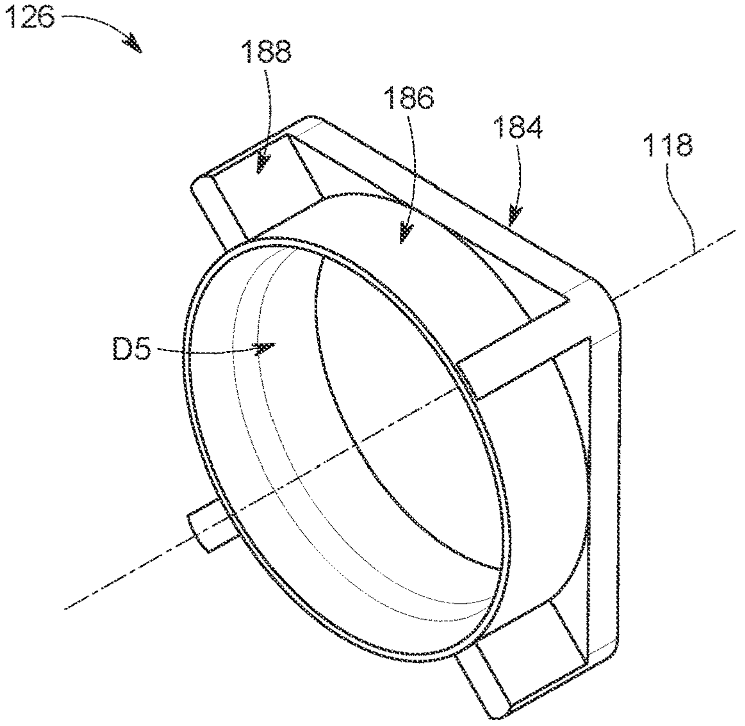
FIG. 7 is a back perspective view illustrating the holder, according to certain aspects of the present disclosure.

Referring to FIG. 7, the exit holder 126 is configured for mounting over the pipe exit side 170 (e.g., as illustrated in FIG. 10). The exit holder 126 has an exit mounting surface 184 that has a generally rectangular or square profile. An exit mounting channel 186 extends from the exit mounting surface 184 along the radial axis 118. The exit mounting channel 186 has an exit holder diameter D5 that has a size slightly larger than the pipe exit diameter D3, for achieving a coupling fit between the exit holder 126 and the pipe exit side 170 (e.g., as illustrated in FIG. 10).

The exit holder 126 further has corner reinforcements 188 that extend above the exit mounting channel 186 at each corner of the exit mounting surface 184. The corner reinforcements 188 are generally rectangular and provide additional structural integrity between the exit mounting surface 184 and the exit mounting channel 186. In an optional configuration, the entry holder 122 and the exit holder 126 are identical components, with respective features being identical to each other (e.g., the entry mounting surface 178 is identical to the exit mounting surface 184).

Figure 8:
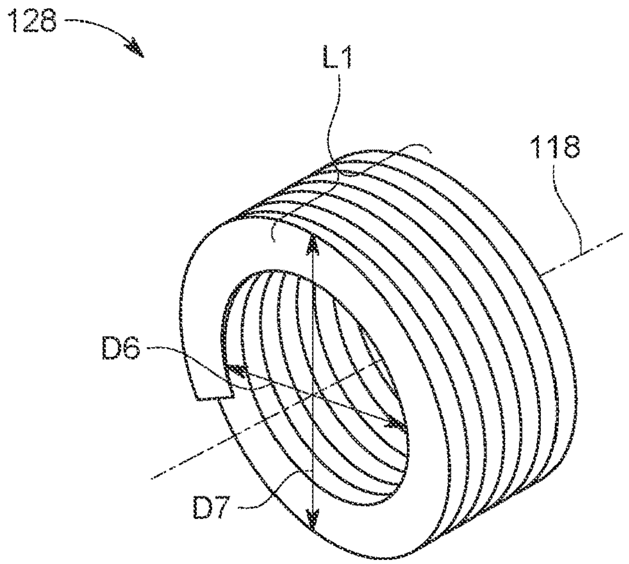
FIG. 8 is a perspective view illustrating a spring of the self-aligning connector, according to certain aspects of the present disclosure.

Referring to FIG. 8, the spring 128 is generally in the form of a compression spring having a radial length L1 that extends along the radial axis 118. The spring 128 has an internal spring diameter D6 and an external spring diameter D7. The internal spring diameter D6 is sufficiently larger than the pipe exit diameter D3 to allow the spring 128 to fit over the pipe exit side 170 (e.g., as illustrated in FIG. 10). The external spring diameter D7 is sized such that the spring 128 fits within the rectangular portion 148 of the case 120 (e.g., as illustrated in FIG. 10).

Figure 9:
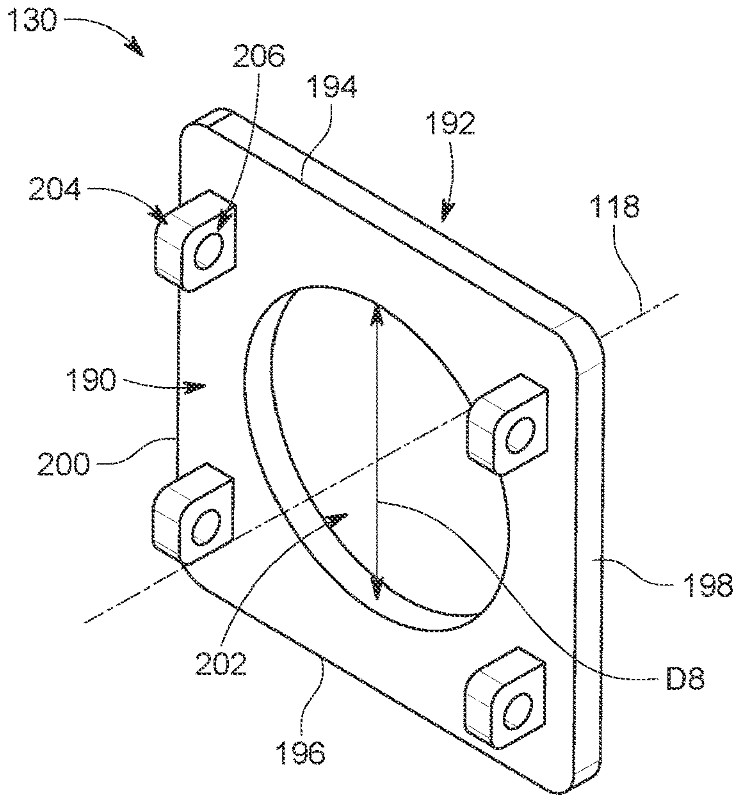
FIG. 9 is a perspective view illustrating a cover of the self-aligning connector, according to certain aspects of the present disclosure.

Referring to FIG. 9, the cover 130 has an exit internal surface 190 and an exit external surface 192. The cover 130 has an external profile that is generally rectangular or square in shape, formed by a top side 194, a bottom side 196, a right side 198, and a left side 200. A cover hole 202 has a diameter D8 that is configured with a size sufficiently larger than the pipe exit diameter D3. The size of the cover hole 202 is sized to allow the cover 130 to fit over the pipe exit side 170 (e.g., as illustrated in FIG. 10).

The cover 130 further has a plurality of mounting tabs 204. Optionally, mounting tabs 204 extend near each corner of the external profile of the cover 130. Each mounting tab 204 has an internal mounting hole 206 for receiving a respective one of the fasteners 132 (shown in FIG. 3) and securing the cover 130 to the case 120 (as illustrated in FIG. 10). Each mounting tab 204 has a generally rectangular or square profile extending from the exit internal surface 190.

Referring to FIG. 10, the self-aligning connector 112 is assembled with the liquid-cooling connector 108, both being aligned along the radial axis 118. Specifically, the liquid-cooling connector 108 has a connector end 208 that is received within the internal channel 174 at the pipe entry end 168. Thus, the liquid-cooling connector 108 is in fluid communication with the self-aligning connector 112.

The self-aligning connector 112 has a floating space 210 that separates the fluid pipe 124 from the internal surface 144 of the pipe channel 134. The floating space 210 allows the fluid pipe 124 to rotate and move linearly relative to the radial axis 118 and relative to the case 120.

The entry holder 122 is mounted over the pipe entry side 166. The entry holder 122 prevents linear movement towards the pipe entry end 168 when the entry holder 122 is in contact with the entry internal surface 146 of the case entry side 136. According to the illustrated example, the entry holder 122 is optionally in direct contact with the entry internal surface 146.

The exit holder 126 is mounted over the pipe exit side 170. The exit holder 126 prevents linear movements of the fluid pipe 124 towards the case exit end 142 when the exit holder 126 is in contact with the exit internal surface 190 of the case exit side 138. According to the illustrated example, the exit holder 126 is optionally in indirect contact with the exit internal surface 190 (based on the in-between mounted spring 128).

The spring 128 is mounted between the exit holder 126 and the case exit end 142. The exit holder 126 is in direct contact with the spring 128 at a first spring end 212. The spring 128 is in direct contact with the exit internal surface 190 at a second spring end 214.

The cover 130 is mounted to the case exit end 142. According to the illustrated embodiment, the cover 130 has (and forms) the exit internal surface 190.

Referring generally to FIGS. 11-16, the self-aligning connector 112 is assembled and coupled with the liquid-cooling connector 108, according to an exemplary embodiment. The assembly process is illustrated as a sequential process, in which each assembly step necessarily follows the previous step. However, in other embodiments the assembly process can be non-sequential.

Figure 11:
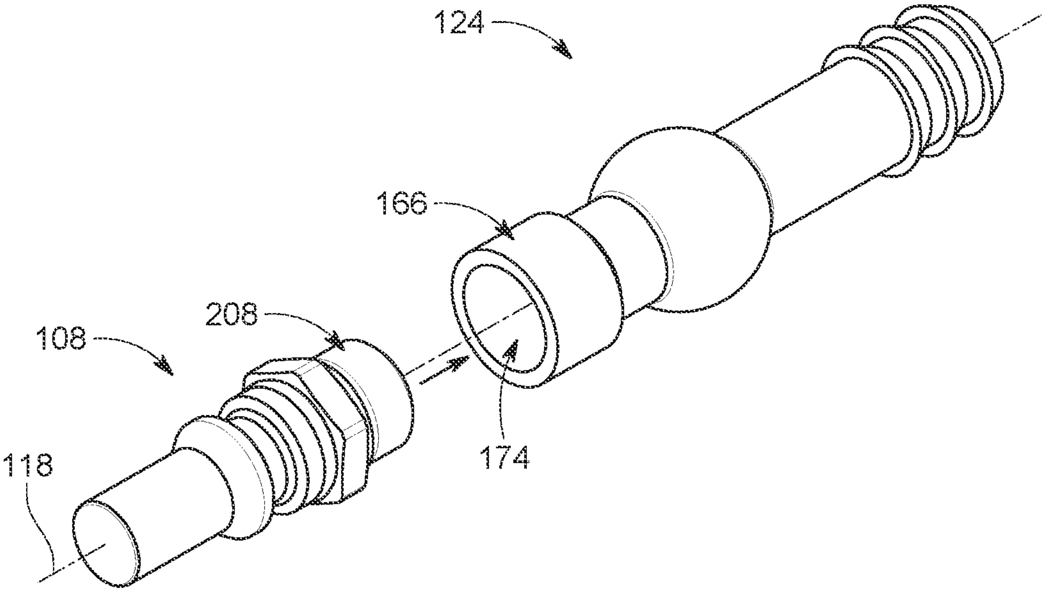
FIG. 11 is a perspective view illustrating coupling of the fluid pipe with a connector plug, according to certain aspects of the present disclosure.

Referring specifically to FIG. 11, the connector end 208 of the liquid-cooling connector 108 is inserted and coupled within the internal channel 174 of the fluid pipe 124, at the pipe entry side 166. The liquid-cooling connector 108 is inserted in a radial direction, along the radial axis 118

Figure 12:
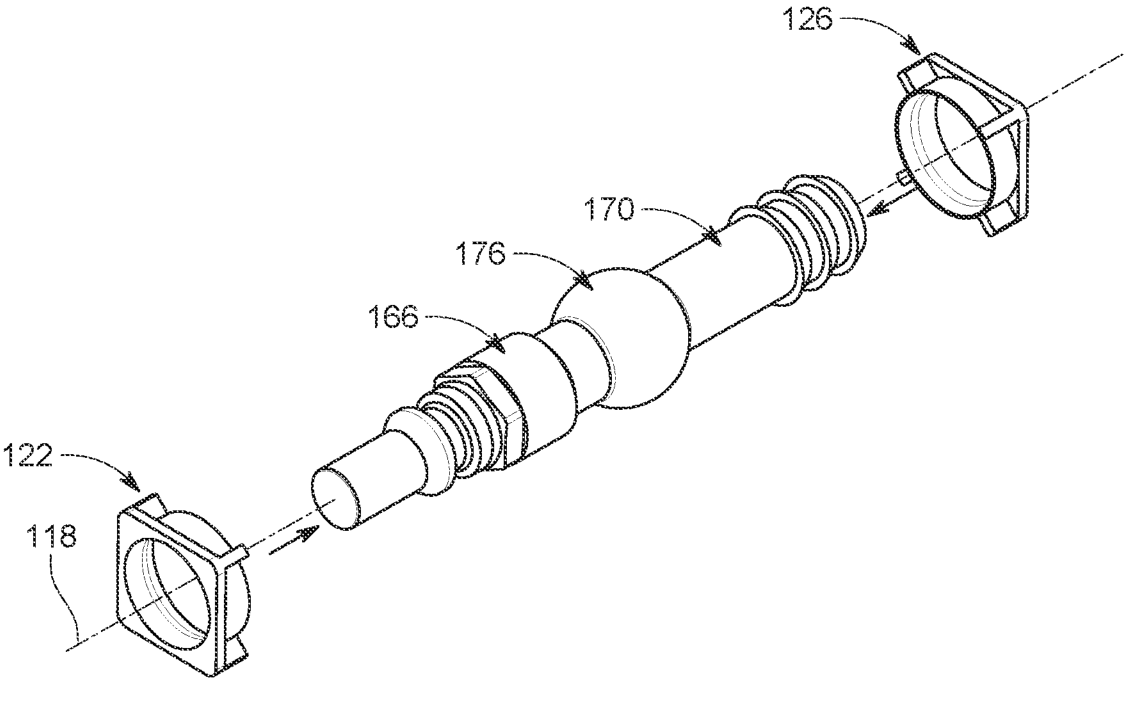
FIG. 12 is a perspective view illustrating coupling of holders with the fluid pipe, according to certain aspects of the present disclosure.

Referring specifically to FIG. 12, the entry holder 122 is mounted over the pipe entry side 166, and the exit holder 126 is mounted over the pipe exit side 170. The entry holder 122 is mounted in a radial direction, along the radial axis 118, from the pipe entry side 166 towards the tilt area 176. The exit holder 126 is mounted in a radial direction, along the radial axis 118, from the pipe exit side 170 towards the tilt area 176.

The entry holder 122 prevents linear movement towards the case entry end 140 (shown in FIG. 4) when the entry holder 122 is in contact with the entry internal surface 146 (shown in FIG. 10) of the case 120. The exit holder 126 prevents linear movement towards the case exit end 142 (shown in FIG. 4) when the exit holder 126 is in contact with an exit internal surface 190 (shown in FIG. 10).

Figure 13:
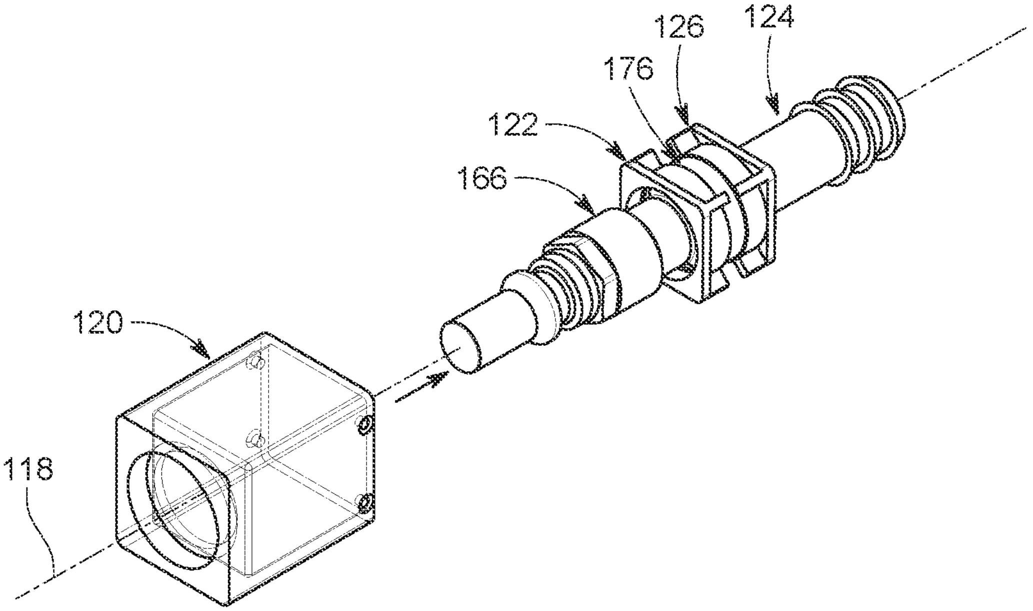
FIG. 13 is a perspective view illustrating coupling of case with the fluid pipe, according to certain aspects of the present disclosure.

Referring specifically to FIG. 13, the case 120 is mounted over the fluid pipe 124 and over the entry and exit holders 122, 126. The case 120 is mounted in a direction, along the radial axis 118, from the pipe entry side 166 towards the tilt area 176.

Figure 14:
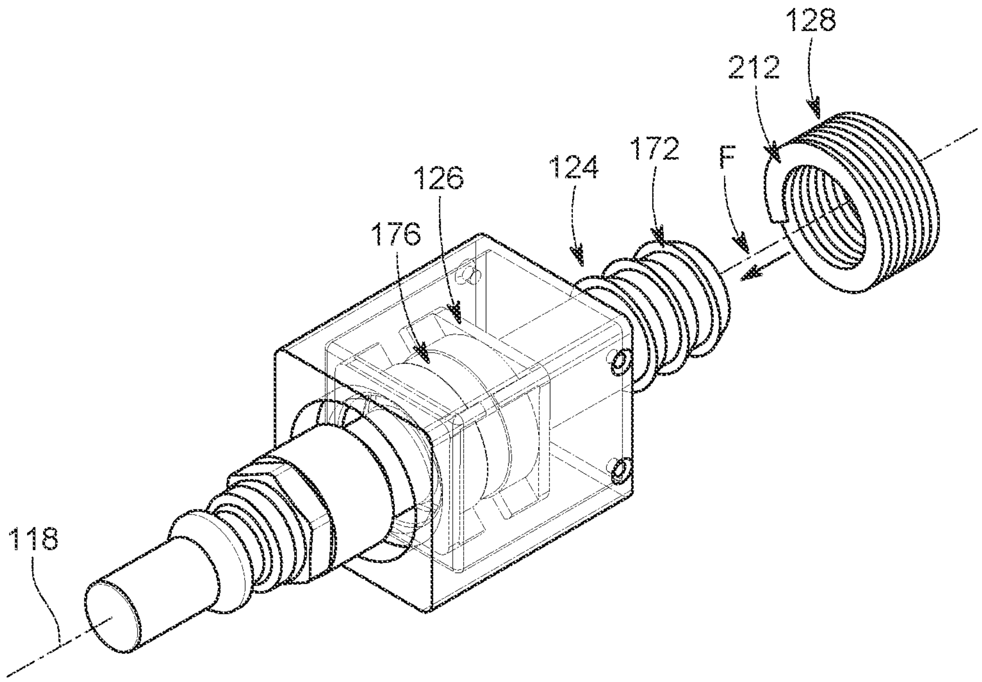
FIG. 14 is a perspective view illustrating coupling of the spring within the case, according to certain aspects of the present disclosure.

Referring specifically to FIG. 14, the spring 128 is mounted over the fluid pipe 124. The spring 128 is inserted along the radial axis 118, in a direction from the pipe exit end 172 towards the tilt area 176. The spring 128 is inserted until the first spring end 212 makes direct contact with the exit holder 126. The spring 128 applies a linear force F to the fluid pipe 124 along the radial axis 118.

Figure 15:
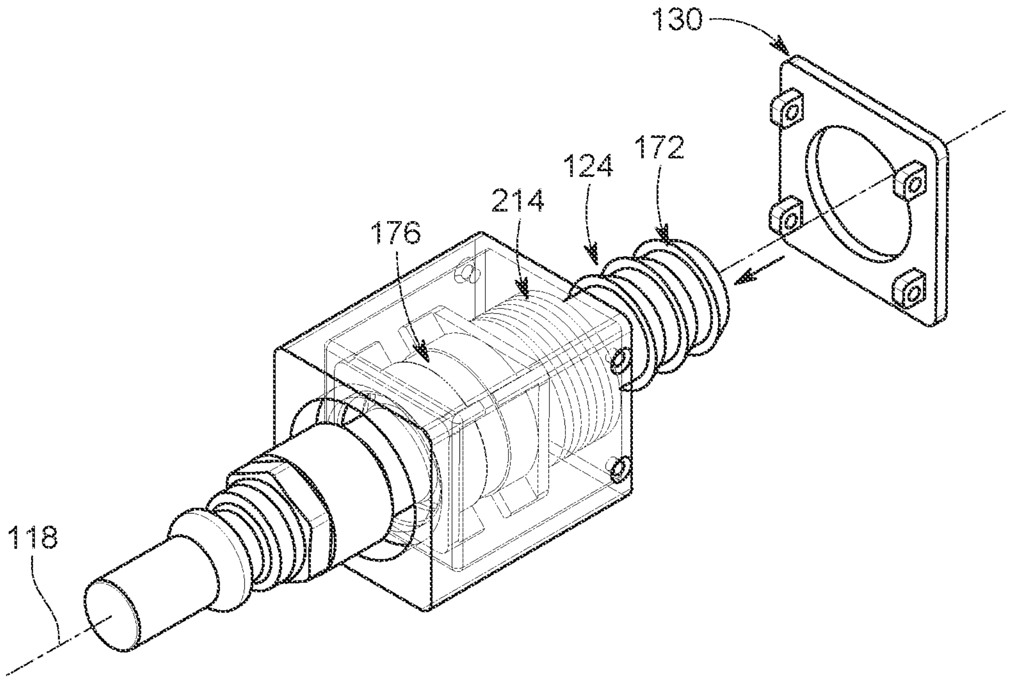
FIG. 15 is a perspective view illustrating positioning the cover with the case, according to certain aspects of the present disclosure.

Referring specifically to FIG. 15, the cover 130 is mounted over the fluid pipe 124. The cover 130 is inserted along the radial axis 118 similar to the spring 128. In other words, the cover 130 is inserted in a direction from the pipe exit end 172 towards the tilt area 176. The cover 130 is inserted until the cover 130 makes direct contact with the second spring end 214.

Figure 16:
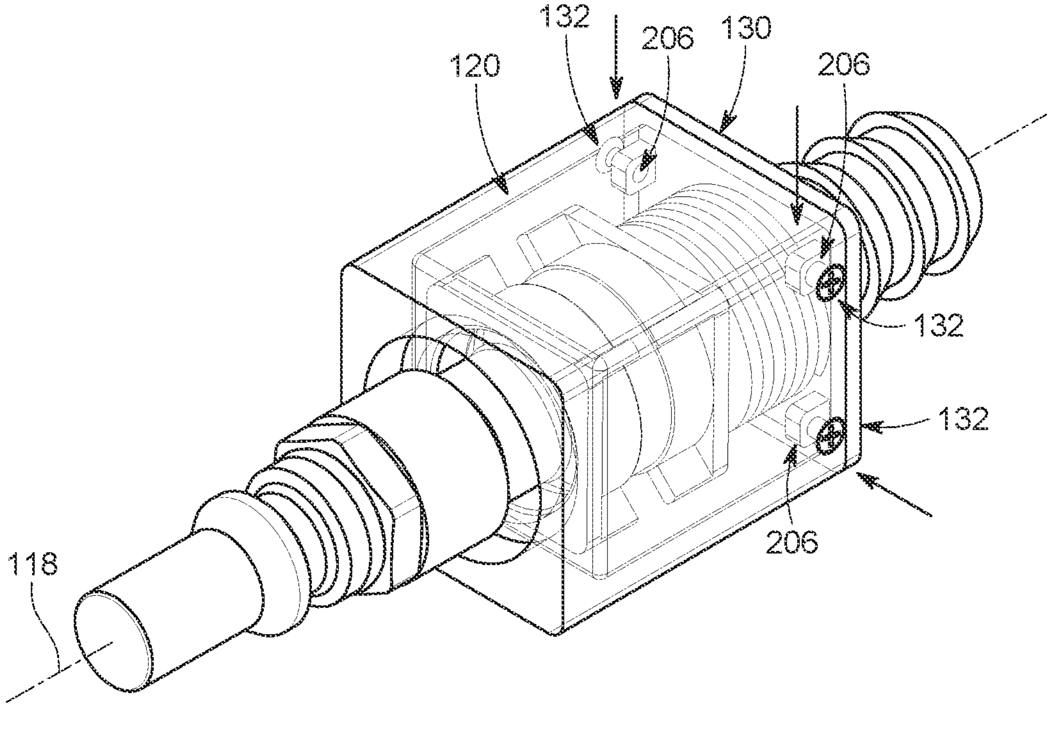
FIG. 16 is a perspective view illustrating fixing of the cover with the case, according to certain aspects of the present disclosure.

Referring specifically to FIG. 16, the cover 130 is fixedly secured to the case 120. More specifically, the fasteners 132 are mounted, respectively, within the mounting holes 206 of the cover 130. After the fasteners 132 secure the cover 130 to the case 120, the self-aligning connector 112 is fully operational and assembled to function with the self-aligning features. Examples of self-aligning features are further disclosed below.

Referring generally to FIGS. 17 and 18, the self-aligning connector 112 has numerous, beneficial self-aligning positions that allow an adjustable connection of the liquid-cooling connector 108. Without the self-aligning connector 112, the liquid-cooling connector 108 would, otherwise, be improperly coupled or it would be impossible to couple the connector socket 110 and the cooling pipe 114 (shown in FIGS. 1 and 2) when, for example, manufacturing or tolerance misalignments occur.

Referring specifically to FIG. 17, the self-aligning connector 112 facilitates a plurality of linear self-aligning positions X1-X4 of the liquid-cooling connector 108. The liquid-cooling connector 108 is linearly adjustable relative to a center position X0 in which a pipe axis 216 of the fluid pipe 124 is radially aligned with the radial axis 118 of the case 120. For example, the fluid pipe 124 is linearly adjustable to a shift up position X1, a shift down position X2, a shift right position X3, and a shift left position X4. Each linearly adjustable position X1-X4 results in the pipe axis 216 of the fluid pipe 124 being shifted linearly relative to the radial axis 118 in a respective direction (e.g., up, down, left, right, etc.).

Referring specifically to FIG. 18, the self-aligning connector 112 also facilitates a plurality of rotational (or angular) self-aligning positions Y1-Y2 of the liquid-cooling connector 108. The liquid-cooling connector 108 is rotatably (or angularly) adjustable relative to the center position X0 in which the pipe axis 216 of the fluid pipe 124 is radially aligned with the radial axis 118 of the case 120. For example, the fluid pipe 124 is rotatably adjustable to a tilt upward position Y1 or a tilt downward position Y2. Each rotatably adjustable position Y1-Y2 results in the fluid pipe 124 being shifted angularly relative to the radial axis 118 in a respective direction (e.g., upward, downward, etc.).

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A self-aligning connector for a computing system, the self-aligning connector comprising:

- a case having a pipe channel extending internally, along a radial axis, between a case entry side and a case exit side, the case entry side having a case entry end, the case exit side having a case exit end;
- a fluid pipe movably mounted within the pipe channel, the fluid pipe being separated from an internal surface of the pipe channel by a floating space, the fluid pipe being rotatably and linearly movable relative to the radial axis within the floating space, the fluid pipe including
  - a pipe entry side with a pipe entry end positioned at the case entry side,
  - a pipe exit side having a pipe exit end positioned at the case exit side,
  - an internal channel for receiving a liquid coolant, the internal channel extending along the radial axis between the pipe entry end and the pipe exit end, and
  - a tilt area located between the pipe entry side and the pipe exit side, the tilt area being configured to rotatably adjust the fluid pipe relative to the case; and
- an entry holder mounted over the pipe entry side, the entry holder preventing linear movement towards the case entry end when the entry holder is in contact with an entry internal surface of the case entry side.

2. The self-aligning connector of claim 1, wherein the entry holder is in direct contact with the entry internal surface.

3. The self-aligning connector of claim 1, further comprising an exit holder mounted over the pipe exit side, the exit holder preventing linear movement towards the case exit end when the exit holder is in contact with an exit internal surface of the case entry side.

4. The self-aligning connector of claim 3, wherein the exit holder is in indirect contact with the exit internal surface.

5. The self-aligning connector of claim 4, further comprising a spring mounted between the exit holder and the case exit end, the exit holder being in direct contact with the spring at a first spring end, the spring being in direct contact with the exit internal surface at a second spring end.

6. The self-aligning connector of claim 5, further comprising a cover, the cover being mounted to the case exit end and forming the exit internal surface.

7. The self-aligning connector of claim 1, wherein the tilt area has a spherical shape.

8. The self-aligning connector of claim 7, wherein the tilt area has a tilt diameter that is larger than at least one of a pipe entry diameter and a pipe exit diameter.

9. The self-aligning connector of claim 1, wherein the pipe exit end is configured for coupling with a liquid cooling pipe.

10. The self-aligning connector of claim 1, wherein the pipe entry end is configured for insertion into a connector socket.

11. The self-aligning connector of claim 1, wherein the fluid pipe is linearly movable within the floating space in one or more translational directions, the one or more translational directions including a first direction along the radial axis and parallel to a length of the case, a second direction perpendicular to the radial axis and parallel to a width of the case, and a third direction perpendicular to the radial axis and parallel to a height of the case.

12. A computing system comprising:

a liquid-cooling server having a liquid cooling pipe for receiving a liquid coolant;

a rack manifold having a connector socket that is in fluid communication with the liquid-cooling server, the rack manifold configured to circulate the liquid coolant to the liquid-cooling server; and a self-aligning connector mounted between the liquid-cooling server and the rack manifold to provide the fluid communication, the self-aligning connector including a case having a pipe channel extending internally, along a radial axis, between a case entry end and a case exit end, and a fluid pipe movably mounted within the pipe channel and separated from an internal surface of the pipe channel by a floating space, the fluid pipe being movable relative to the radial axis within the floating space, the fluid pipe including a pipe entry end positioned near the case entry end, a pipe exit end positioned near the case exit end and coupled to the liquid cooling pipe, an internal channel for receiving the liquid coolant, the internal channel extending along the radial axis between the pipe entry end and the pipe exit end, and an adjustable area located between the pipe entry end and the pipe exit end, the adjustable area being configured to movably adjust the fluid pipe within the case;

wherein the self-aligning connector further includes an entry holder mounted over the fluid pipe near the pipe entry end, the entry holder preventing linear movement towards the case entry end when the entry holder is in contact with an entry internal surface of the case.

13. The computing system of claim 12, wherein the adjustable area is configured to rotatably adjust the fluid pipe within the case.

14. The computing system of claim 12, wherein the adjustable area is configured to linearly adjust the fluid pipe within the case.

15. The computing system of claim 12, wherein the adjustable area is configured to rotatably and linearly adjust the fluid pipe within the case.

16. The computing system of claim 12, wherein the adjustable area is in the form of a tilt area that has a spherical shape.

17. The computing system of claim 12, wherein the self-aligning connector further includes a spring mounted near the pipe exit end, the spring applying to the fluid pipe a linear force along the radial axis.

18. The computing system of claim 12, wherein the self-aligning connector further includes an exit holder mounted over the fluid pipe near the pipe exit end, the exit holder preventing linear movement towards the case exit end when the exit holder is in contact with an exit internal surface of the case.

19. A self-aligning connector for a computing system, the self-aligning connector comprising:

a case having a pipe channel extending internally, along a radial axis, between a case entry side and a case exit side, the case entry side having a case entry end, the case exit side having a case exit end;

a fluid pipe movably mounted within the pipe channel, the fluid pipe being separated from an internal surface of the pipe channel by a floating space, the fluid pipe being rotatably and linearly movable relative to the radial axis within the floating space, the fluid pipe including a pipe entry side with a pipe entry end positioned at the case entry side, a pipe exit side having a pipe exit end positioned at the case exit side, an internal channel for receiving a liquid coolant, the internal channel extending along the radial axis between the pipe entry end and the pipe exit end, and a tilt area located between the pipe entry side and the pipe exit side, the tilt area being configured to rotatably adjust the fluid pipe relative to the case; and an exit holder mounted over the pipe exit side, the exit holder preventing linear movement towards the case exit end when the exit holder is in contact with an exit internal surface of the case entry side.

20. A computing system comprising:

a liquid-cooling server having a liquid cooling pipe for receiving a liquid coolant;

a rack manifold having a connector socket that is in fluid communication with the liquid-cooling server, the rack manifold configured to circulate the liquid coolant to the liquid-cooling server; and a self-aligning connector mounted between the liquid-cooling server and the rack manifold to provide the fluid communication, the self-aligning connector including a case having a pipe channel extending internally, along a radial axis, between a case entry end and a case exit end, and a fluid pipe movably mounted within the pipe channel and separated from an internal surface of the pipe channel by a floating space, the fluid pipe being movable relative to the radial axis within the floating space, the fluid pipe including a pipe entry end positioned near the case entry end, a pipe exit end positioned near the case exit end and coupled to the liquid cooling pipe, an internal channel for receiving the liquid coolant, the internal channel extending along the radial axis between the pipe entry end and the pipe exit end, and an adjustable area located between the pipe entry end and the pipe exit end, the adjustable area being configured to movably adjust the fluid pipe within the case;

wherein the self-aligning connector further includes an exit holder mounted over the fluid pipe near the pipe exit end, the exit holder preventing linear movement towards the case exit end when the exit holder is in contact with an exit internal surface of the case.

* * * * *